(12) United States Patent
Aylward

(10) Patent No.: US 9,712,127 B2
(45) Date of Patent: Jul. 18, 2017

(54) INTELLIGENT METHOD AND APPARATUS FOR SPECTRAL EXPANSION OF AN INPUT SIGNAL

(76) Inventors: Richard Aylward, Ashland, MA (US); Ruth Aylward, legal representative, Ashland, MA (US)

( * ) Notice: Subject to any disclaimer, the term of this patent is extended or adjusted under 35 U.S.C. 154(b) by 468 days.

(21) Appl. No.: 13/540,575

(22) Filed: Jul. 2, 2012

(65) Prior Publication Data
US 2013/0177170 A1 Jul. 11, 2013

Related U.S. Application Data

(60) Provisional application No. 61/585,588, filed on Jan. 11, 2012.

(51) Int. Cl.
| | |
|---|---|
| H03G 5/00 | (2006.01) |
| H03G 5/16 | (2006.01) |
| H04R 3/04 | (2006.01) |
| G01R 19/02 | (2006.01) |

(52) U.S. Cl.
CPC ............ *H03G 5/165* (2013.01); *G01R 19/02* (2013.01); *H03G 5/005* (2013.01); *H04R 3/04* (2013.01)

(58) Field of Classification Search
CPC ... H04R 3/00; H04R 3/04; H04R 3/06; H04R 3/08; H04R 5/04; H03G 5/00; H03G 5/005; H03G 5/10; H03G 5/165; H03G 5/025; H03G 5/04; H03G 5/18; H03G 9/005; H03G 9/025; H03G 9/18; H03G 3/20; H03G 3/30; H03G 3/32; H03G 7/001; H03G 7/002; H03G 7/007; H04S 7/307; G01R 19/02

USPC .... 381/98, 101–103, 107, 99; 327/348, 347, 327/346

See application file for complete search history.

(56) References Cited

U.S. PATENT DOCUMENTS

| | | | |
|---|---|---|---|
| 5,027,410 A * | 6/1991 | Williamson et al. | 381/320 |
| 5,172,358 A * | 12/1992 | Kimura | H03G 5/005 369/47.26 |
| 2005/0254663 A1 * | 11/2005 | Raptopoulos | G10K 11/175 381/71.1 |

(Continued)

OTHER PUBLICATIONS http://www.soulelectronics.com/partyinabox/.
Self, D., "Small Signal Audio Design," Taylor & Francis Publishers, p. 503 (Mar. 2010).

*Primary Examiner* — Vivian Chin
*Assistant Examiner* — Con P Tran
(74) *Attorney, Agent, or Firm* — Hamilton, Brook, Smith & Reynolds, P.C.

(57) ABSTRACT

A method, and a corresponding apparatus, for processing an input signal comprise filtering the input signal to separate a passband frequency component of the input signal from a stopband frequency component of the input signal, and adjusting relative signal power values of the passband frequency component and the stopband frequency component of the input signal based at least in part on signal values of a number of samples associated with the input signal. In the case of audio signals, for example, such processing is used for spectral expansion of the input signal by enhancing the power of the stopband, or low and high frequencies, component with respect to the power of the passband component of the input signal. As a result, a better audio quality is achieved.

6 Claims, 7 Drawing Sheets

(56) References Cited

U.S. PATENT DOCUMENTS

| | | | |
|---|---|---|---|
| 2007/0291959 A1* | 12/2007 | Seefeldt | H03G 3/32 381/104 |
| 2008/0152168 A1* | 6/2008 | Magrath | 381/100 |
| 2009/0323983 A1* | 12/2009 | De Muynke et al. | 381/98 |
| 2012/0177226 A1* | 7/2012 | Silverstein et al. | 381/107 |
| 2013/0010972 A1* | 1/2013 | Ma | 381/23.1 |
| 2013/0142360 A1* | 6/2013 | Potard | 381/98 |
| 2013/0216053 A1* | 8/2013 | Disch | 381/61 |

\* cited by examiner

INTELLIGENT METHOD AND APPARATUS FOR SPECTRAL EXPANSION OF AN INPUT SIGNAL

RELATED APPLICATION

This application claims the benefit of U.S. Provisional Application No. 61/585,588, filed on Jan. 11, 2012.

The entire teachings of the above application are incorporated herein by reference.

BACKGROUND OF THE INVENTION

Over the years there has been a lot of research interest in the human hearing mechanism and human perception of sounds. Better understanding of the human hearing system, lead to improvements in electronic devices and systems providing enhanced acoustic, or audio, quality.

SUMMARY OF THE INVENTION

According to at least one example embodiment, a method of processing an input signal comprises filtering the input signal to separate a passband frequency component of the input signal from a stopband frequency component of the input signal, and adjusting relative signal power, or amplitude, values of the passband frequency component and the stopband frequency component of the input signal based at least in part on signal values of a number of samples associated with the input signal.

The filtering of the input signal may be achieved using a band-pass filter or a band-stop filter. The adjusting of the relative signal power, or amplitude, values of the passband frequency component and the stopband frequency component of the input signal is based, at least in part, on a detected signal level of the number of samples associated with the input signal. The detected signal level may be computed, for example, using a root mean square value of the signal values of the samples associated with the input signal. Alternatively, the detected signal level may be computed using an averaging metric providing an average, or weighted average, value of the power or amplitude values corresponding to the samples of the input signal. The samples associated with the input signal may be samples of the input signal or samples of a filtered version of the input signal.

According to another example embodiment an apparatus for processing an input signal comprises a filter configured to filter the input signal to separate a passband frequency component of the input signal from a stopband frequency component of the input signal, and a power adjusting component configured to adjust relative signal power values of the passband frequency component and the stopband frequency component of the input signal based at least in part on signal values of a number of samples associated with the input signal.

According yet to another example embodiment, a non-transitory computer-readable medium including computer software instructions stored thereon, for processing and input signal, the computer software instructions when executed by a processor cause an apparatus to filter the input signal to separate a passband frequency component of the input signal from a stopband frequency component of the input signal, and adjust relative signal power values of the passband frequency component and the stopband frequency component of the input signal based at least in part on signal values of a number of samples associated with the input signal.

The example method(s), apparatus(es), and computer-readable medium, described herein, enable enhancing audio signal quality by enhancing the relative power, or amplitude, value of low and high frequencies' component with respect to the mid-band or passband component of the corresponding audio signal. Such power, or amplitude, enhancement is performed in correlation with a detected signal level of samples associated with the audio signal. The proposed approaches are easy to implement, computationally efficient, and provide significant improvement(s) in terms of quality of resulting output signal.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of the example embodiments of the invention follows.

Figure 1A:
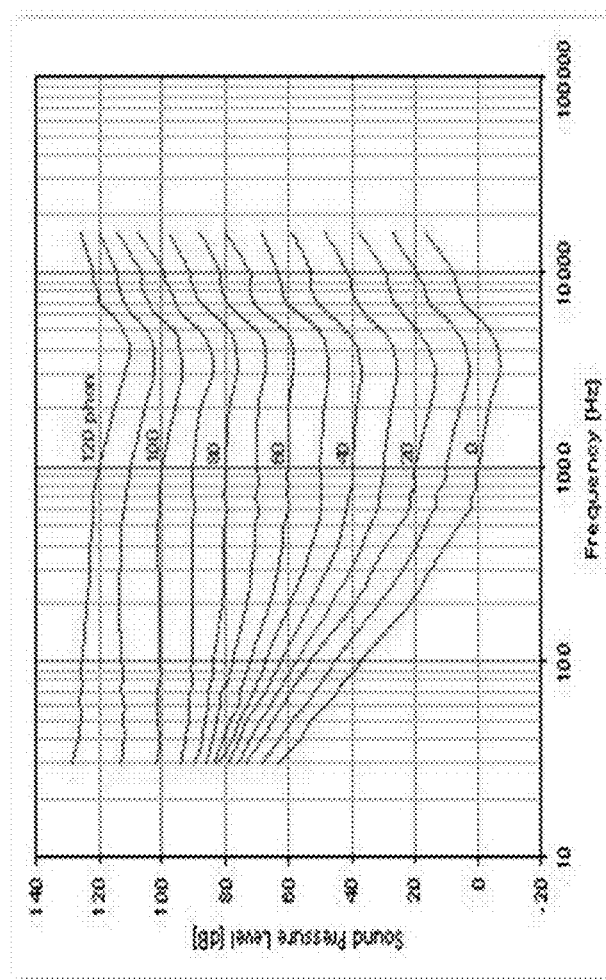
FIGS. 1A and 1B show curves illustrating human hearing perception in terms of loudness and frequency.
Figure 1B:
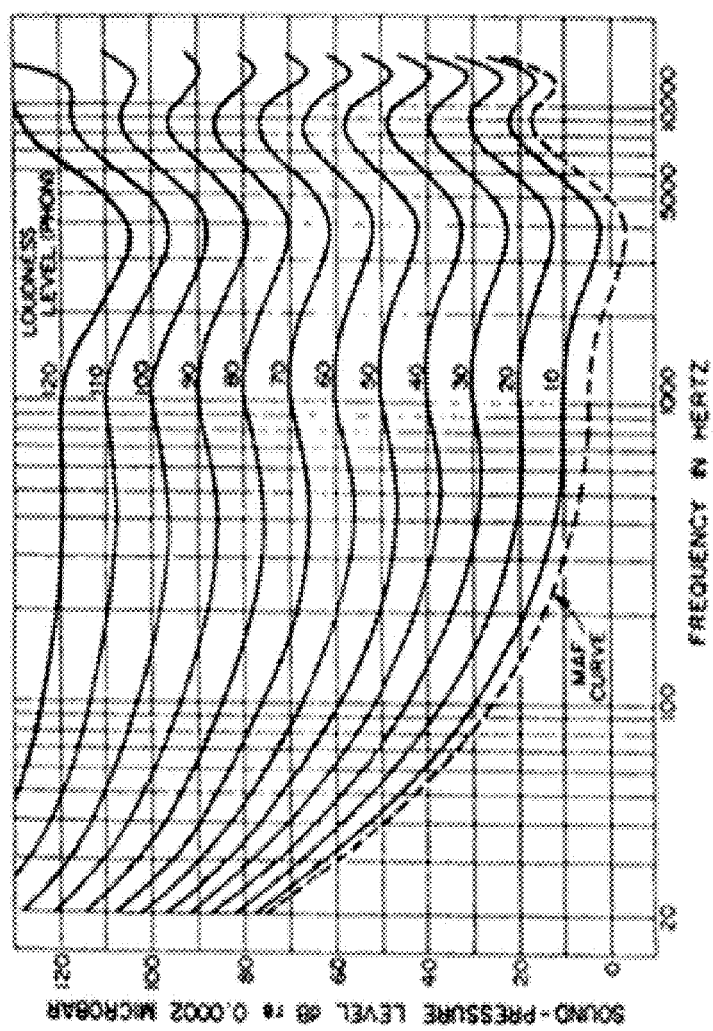

FIGS. 1A and 1B show curves illustrating human hearing perception in terms of loudness and frequency. Specifically, FIG. 1A shows the Fletcher-Munson Equal Loudness curves, while FIG. 1B shows the Robinson-Dadson Equal Loudness curves. Points on the same curve represent pairs of frequency—sound pressure at which sounds are subjectively perceived by a listener as being equally loud. Each curve corresponds to a loudness level expressed in "phons". One phon is equal to a sound pressure level of 1 dB, relative to a reference pressure, at a frequency of one kHz.

A subjective estimate of the human hearing response, at different loudness levels, may be obtained by inverting the curves of FIG. 1A or FIG. 1B. While the human ear may be able to hear sounds in the range of 20 Hz to 20,000 Hz (20 kHz), the curves in FIGS. 1A and 1B clearly show peaks, at different loudness levels, in hearing sensitivity at a between 1 kHz and 5 kHz. However, with increase in age, human ear experience decreased above 2 kHz.

Both FIGS. 1A and 1B show that curves associated with relatively higher loudness levels exhibit relatively less variation in sound pressure level across different frequencies. For example, humans may hear all, or most of, the musical notes, e.g., as on an 88 key piano, almost equally when the music is being played at a sound pressure level of around 100 dB at the listener's ears. At very low loudness levels, the human ear is more sensitive to sounds at mid-band frequencies and less sensitive to audio signals at low or high frequency bands. Not coincidentally, 100 dB is the level that a classical orchestra works at on the average, and the same is roughly true of an outdoor performance of a marching band, bagpipe troop, drum line, etc.

An early example documentation of human hearing perception occurred in the 1930's at Bell Labs with what is now known as the Fletcher-Munson Equal Loudness curves, shown in FIG. 1B. Since then, multiple attempts have been made by audio equipment engineers to correct for the unequal perception of midrange and bass frequencies. Some of the first attempts to compensate for the variation in hearing perception in terms of frequency and level of loudness proposed using the position of the volume control as an indicator of how much the bass frequencies should be emphasized. Specifically, the lower the volume control setting is, the more the bass signal is emphasized. Since volume control position never correlates well with actual volume, the approach, though ubiquitous, rarely worked well.

Later attempts included real-time sensing of loudness level and corresponding adjustment of a frequency selective voltage controlled amplifier circuit. While performing better than volume control position sensor types, this sort of approach invariably has difficulties with both speed and accuracy. Such solutions may tend to be plagued by audible artifacts, such as "breathing," that are obvious and objectionable.

Conventional approaches to remedy the variation in human hearing perception are typically implemented using Digital Signal Processing (DSP). Such implementations, generally, simply use a set of analog techniques realized in DSP form. DSP based implementations may be expensive to implement, e.g., in terms of required DSP "horsepower" or "MIPS," while still having difficulties with speed, accuracy, and artifacts.

In the following, example embodiments employ a mathematical model to achieve reliable and efficient compensation, to the variation in hearing perception, at a very high speed. Artifacts by the proposed embodiments, if any, are effectively completely inaudible, except may be to some of the most highly trained listeners.

Figure 2A:
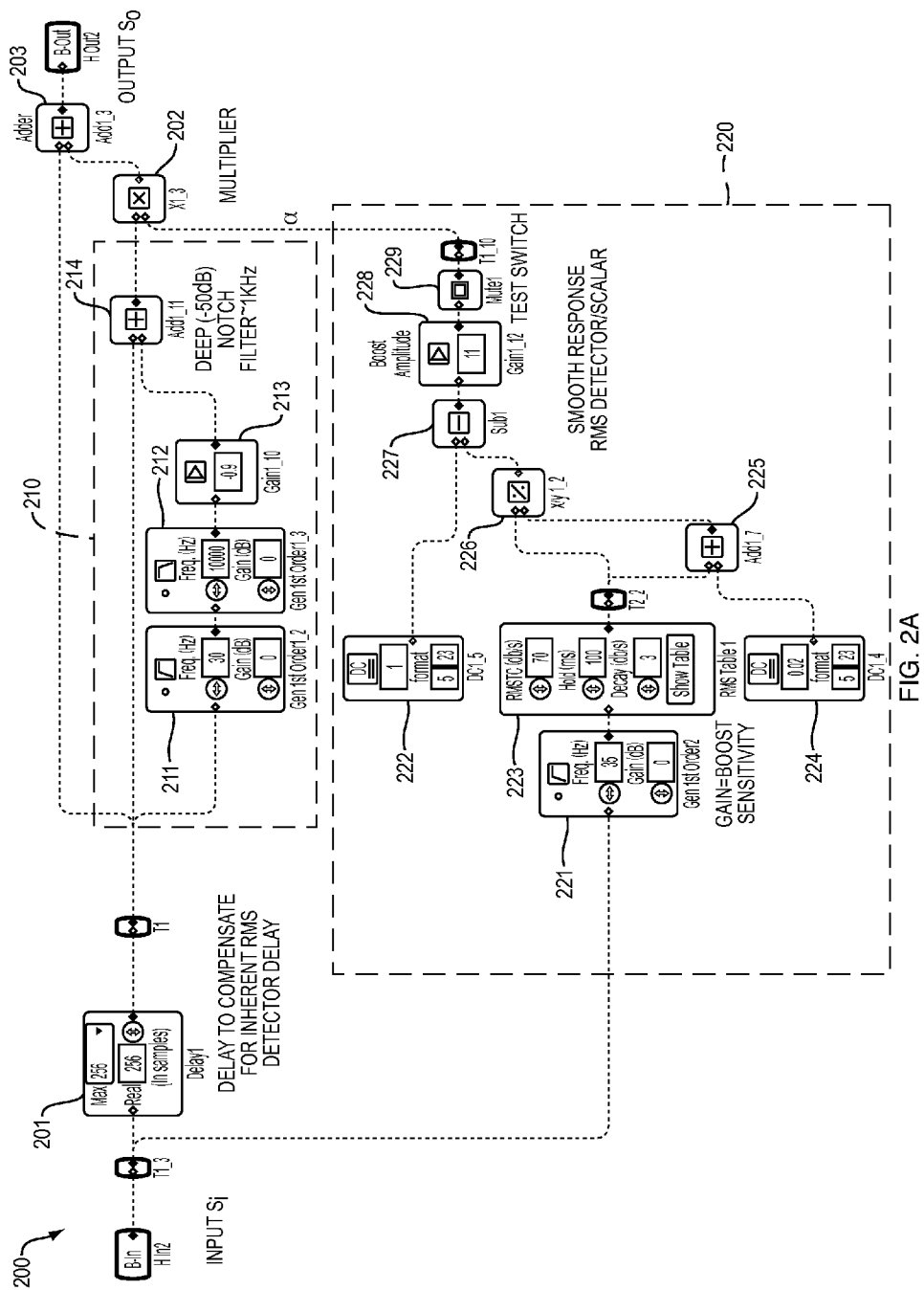
FIGS. 2A-2C show a circuit device for spectral expansion of an input signal, in accordance with at least one example embodiment.

FIG. 2A shows a circuit device 200 according to an example embodiment. The circuit device enables psychoacoustic spectral expansion in audio signals. The circuit device comprises two main components a band-stop filter, or a notch filter, 210 and a Root Mean Square (RMS) scaling component 220. The band-stop filter 210 is designed in a way to filter out a mid-band, or band pass, component of an input audio signal $S_i$. In other words, the output signal of the band-stop filter may be viewed as the sum of low and high frequency components of the input audio signal. In mathematical terms, the input audio signal $S_i$ may be described as:

$$S_i = S_{LH} + S_{BP}, \quad (1)$$

where $S_{LH}$ is the output of the stop band filter 210 and $S_{BP}$ is the band pass component. With regard to FIGS. 1A and 1B, such low and high frequency components correspond to relatively lower hearing sensitivity.

The RMS scaling component 220 makes use of the root mean square of a number of signal samples associated with the input signal $S_i$ to calculate a scaling factor $\alpha$. The output of the stop band filter $S_{LH}$ is then multiplied, through the multiplier 202, by the scaling factor $\alpha$. The fact that the RMS scaling component makes use of a number of signal samples, an inherent delay is associated with the calculation of the scaling factor $\alpha$. In order to synchronize the computed scaling factor $\alpha$ with the output of the stop-band filter 210, a delay component 201 is used to introduce a similar delay, e.g., equal to the inherent delay of the RMS scaling component, to the input of the stop-band filter. The delay component 201 may be a delay line or any delay module known in the art. The adder 203 adds the scaled output of the stop-band filter and a delayed version of the input signal $S_i$ to generate the output signal $S_o$. In other words, the output signal at a time instance t may be described as:

$$S_o(t) = \alpha \cdot S_{LH}(t-d) + S_i(t-d), \quad (2)$$

where d represents the time delay introduced by the delay component 201.

Figure 2B:
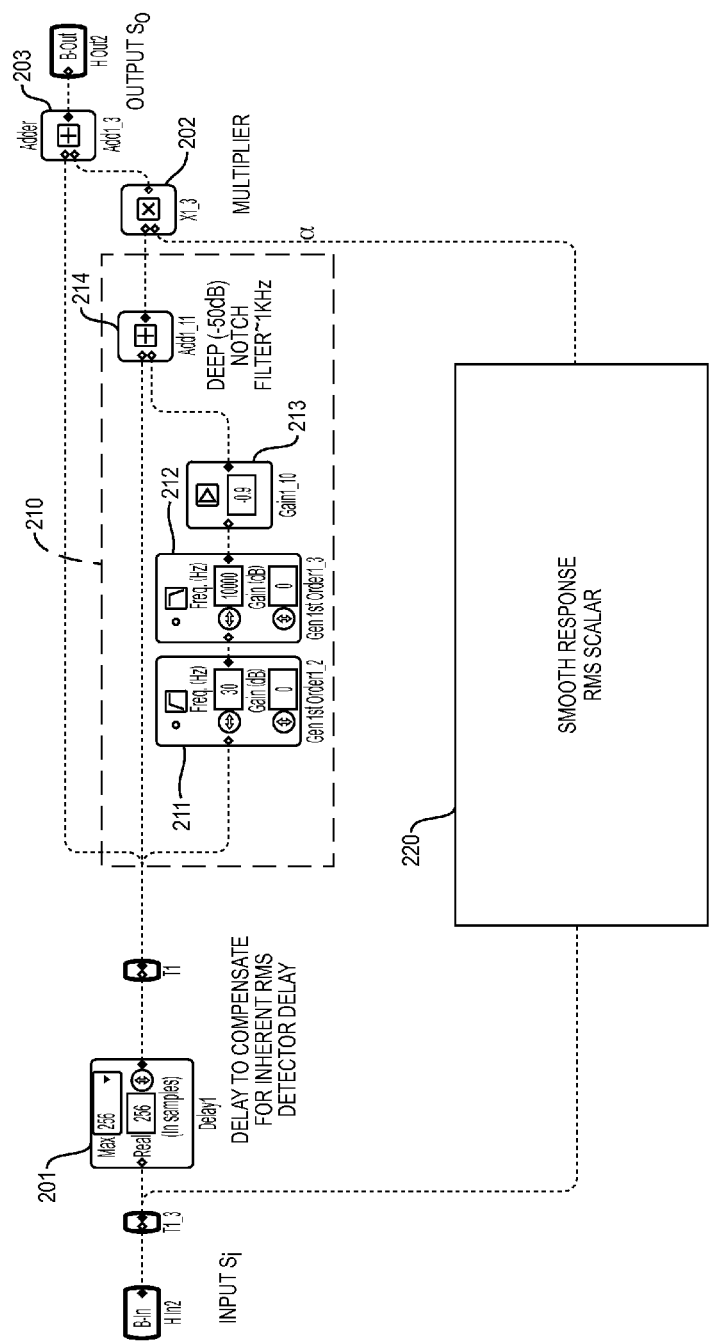

FIG. 2B shows the circuit of FIG. 2A with the details of the RMS scaling component 220 being hidden. However, the different components of the stop-band filter 210 are shown. The stop-band filter is implemented using a concatenation of two first-order filters 211 and 212, a gain component 213 and an adder 214. The first-order filter 211 has a cut-off frequency $f_1$, e.g., 30 Hz. The filter 211 filters out the low frequency component of the delayed input signal $S_i$. In other words, the pass band of the filter 211 corresponds to frequencies above the cut-off frequency $f_1$, e.g., 30 Hz. The first-order filter 212 has a cut-off frequency $f_2$, e.g., 10 kHz and a pass band corresponding to frequencies below the cut-off frequency $f_2$. The concatenation of the filters 211 and 212 represents a band-pass filter with cut-off frequencies $f_1$ and $f_2$. The gain component 213 applies a negative gain, e.g., $-0.9$, to the output of the filter 212. The output of the gain component 213 is then added, at the adder 214, to the delayed input signal $S_i$ to result in the low and high frequency component $S_{LH}$ of the input signal $S_i$. In other words, the structure comprising the filter 211 and 12, the gain component 213, and the adder 214 is a stop-band filter with cut-off frequencies $f_1$ and $f_2$.

A person skilled in the art should appreciate that the values of the frequencies $f_1$ and $f_2$, e.g., 30 Hz and 10 kHz, are not to be interpreted as limiting but rather as example values that were found to result in enhanced audio quality. According to other example embodiments, $f_1$ may be larger than 30 Hz. According to even other example embodiments, the cut-off frequency $f_2$ may be larger or smaller than 10 kHz. Also the gain value 0.9, of the gain component 213, should not be interpreted as limiting. For example, other values close to, but greater than or equal to, $-1.0$ may also be used. Examples of such values include $-1.0$, $-0.95$, or $-0.85$. A skilled person in the art should appreciate that such values may be selected based on simulation results.

Figure 2C:
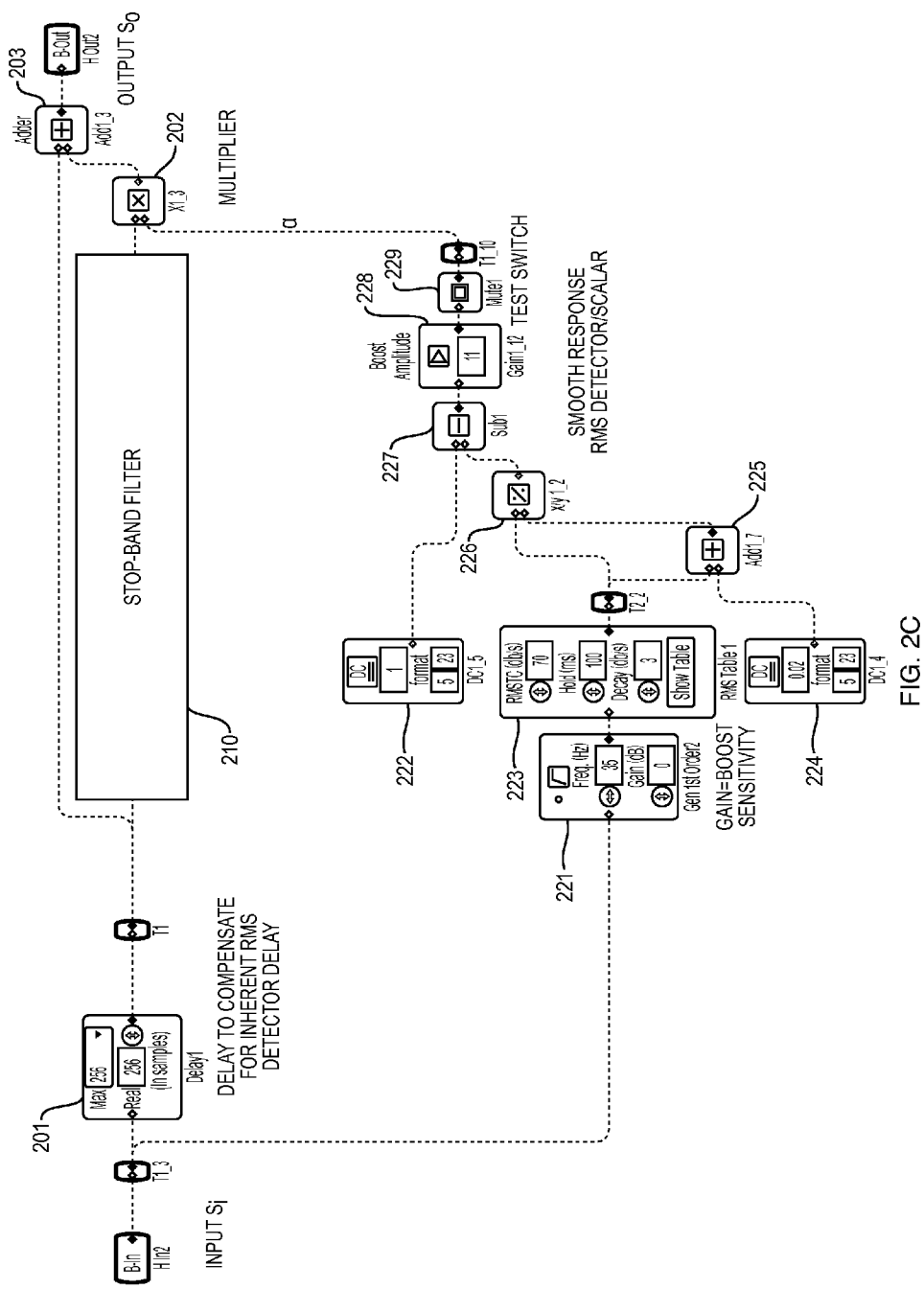

FIG. 2C shows the circuit of FIG. 2A with the details of the stop-band filter 210 being hidden. However, the different components of the RMS scaling component 220 are shown. The RMS scaling component 220 includes a first-order filter 221. The first-order filter 221 has a cut-off frequency, e.g., equal to 35 Hz, and a passband corresponding to frequencies larger than corresponding cut-off frequency. A number of samples, e.g., $s_1, s_2, \ldots, s_N$, of the filtered input signal are used to calculate a Root Mean Square (RMS) value R, at the RMS calculator 223, $$R = \sqrt{\frac{1}{N}(s_1^2 + s_2^2 + \ldots + s_N^2)}. \quad (3)$$

The samples $s_1, s_2, \ldots, s_N$, are time sampled values of the output signal of the filter 221. The number of samples N may be determined, for example, based on a time interval across which the RMS value is to be calculated and a sampling time period. Using DC value generators 222 and 224, an adder 225, d divider 226, a subtractor 227 and a gain component 228, an amplitude dependent scaling value is computed as:

$$\alpha = \beta \left(1 - \frac{R}{R + V_{ref}}\right). \quad (4)$$

The value corresponds to the gain, or amplification, value introduced by the gain component 228. The value $V_{ref}$ represents a reference value generated by the DC generator 224. According to at least one example embodiment the reference value is equal to the absolute threshold of hearing known in the art to be equal to 20 µPa, or 20 $10^{-6}$ Pa, in terms of sound pressure. In the case where one Pa, in sound pressure, is transformed into one Volt in electric potential difference and the samples $s_1, s_2, \ldots, s_N$ are measured in milli-Volts, then the reference value is equal to 0.02, $V_{ref}$=0.02. While the use of the absolute threshold of hearing seems a natural choice, other example embodiments may use different values for $V_{ref}$. For example, a value larger than the absolute threshold of hearing may be used. The amplitude dependent scaling value α is used by the multiplier 202 to amplify the output, $S_{LH}$, of the stop-band filter 210, which is then added by the adder 203 to a delayed version of the input signal $S_i$. The RMS scaling component may further include a test switch 229. The test switch 229 may be used, for example, to synchronize the output of the RMS scaling component 220 with the output of the stop-band filter 210. Alternatively, the test switch 229 may be omitted in the circuit device 200.

It should be appreciated by a person skilled in the art that the RMS scaling component in FIGS. 2A-2C describes an illustrative example of using smooth amplitude dependent scaling to enhance low and high frequency components of the input signal $S_i$. For example, other values of the cut-off frequency of the filter 221, e.g., other than 35 Hz, may be used. According to another example embodiment, a band-pass filter may be used instead of the first-order filter 221. The band-pass filter may be similar to the band-pass filter represented by the concatenation of filters 211 and 212. Other high-pass or band-pass filters may be used instead of the filter 221. According to even another example embodiment, the filter 221 may be simply omitted. Other example embodiments may employ different metrics instead of the RMS value, such as $$R = \frac{1}{N}(|s_1| + |s_2| + \ldots + |s_N|) \quad (5)$$

where, in this case an average of the absolute values of the samples $s_1, s_2, \ldots, s_N$ is used instead of the RMS. In general, the use of multiple samples of the input signal, or filtered version of the input signal, to calculate the amplitude dependent scaling value α enables amplitude dependent enhancement of low and high frequency components of the input signal while reducing the effect of high variation in the amplitudes of the input signal samples. In other words, the use of averaging across different samples, as shown in equations (3) and (5), guarantees smooth amplitude dependence and as such reduces, or eliminates, the effect of potential high variation in samples' amplitudes or any additive noise.

The circuit device described in FIGS. 2A-2C may be implemented in different ways. For example, considering equations (1), equation (2) may be written as:

$$S_o(t) = (1+\alpha) \cdot S_i(t-d) - S_{BP}(t-d). \quad (6)$$

Using equation (6), the circuit device of FIGS. 2A-2C may be implemented without a stop-band filter.

Figure 3:
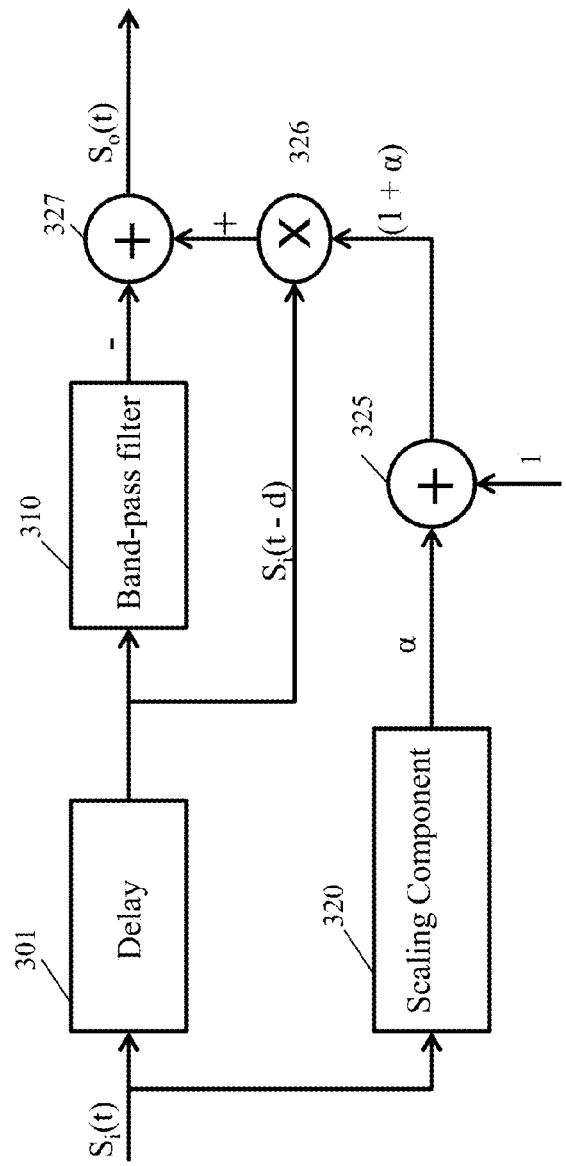
FIG. 3 show a circuit device for spectral expansion of an input signal, in accordance with other example embodiments.

FIG. 3 illustrates an implementation of a circuit device for psycho-acoustic spectral expansion in accordance with another example embodiment. The implementation shown in FIG. 3 corresponds to equation (6). Multiple samples of the input signal $S_i(t)$ are used at each time instance t to compute a scaling value α by the scaling component 320. The input signal is delayed, at the delay component 301, to compensate for the time delay associated with computing the scaling value α. The delayed input signal is filtered using a band-pass filter 310. In order to compute the output signal, at the time instance t, the delayed input signal $S_i(t-d)$ is multiplied by $(1+\alpha)$, at the multiplier 326, and the output of the band-pass filter 310 is subtracted at the adder 327 from the result of the multiplication. This example implementation does not make use of a band-stop filter as is the case in FIGS. 2A-2C. The scaling component 320 may make use of the RMS of the signal values of the multiple samples of the input signal to calculate the scaling α. Alternatively, the scaling component 320 may use the absolute average of the signal values of the multiple samples of the input signal. Other smoothing metrics may alternatively be applied to power or amplitude values of the multiple samples of the input signal. As in FIGS. 2A-2C, the input signal may be filtered prior to feeding corresponding samples to the scaling component 320. Such filtering may be achieved using a band-pass, a low-pass filter or high-pass filter, to eliminate a low frequency component, a high frequency component, or a low and high frequencies' component of the input signal, respectively.

According to an example embodiment, a circuit device for spectral expansion of an input signal is implemented using a proprietary sample based RMS level detector and lookup-table, a pair of simple 6 dB per octave filters, and some add-subtract-multiply-divide DSP primitives. Alternatively, the level detector used to detect the power or amplitude level of the input signal may be implemented using an average of the absolute signal values of samples of the input signal, or filtered input signal. In FIGS. 2A-2C, the level detector is the RMS calculator 223, whereas with respect to FIG. 3, the level detector is the component or that calculates the absolute average described in equation (5). In other words, the level detector is the component that measures an averaged power or amplitude level of samples of the input signal or samples of the filtered input signal. A person skilled in the art should appreciate that such level may also be calculated using weighted averaging of the signal values associated with the samples associated with input signal.

According to example embodiments, described herein, implementations of a device for spectral expansion of an input signal operate at very high speed and yield accurate results and almost totally artifact free output audio signals. The different implementations, described herein, provide an approach for adjusting relative power, or amplitude, levels of the passband component and the stopband component of the input signal. According to an example embodiment, the passband refers to frequencies within a range, whereas the stopband refers to the frequencies outside the same range. Since outside of the level detector there are only very low resource usage DSP primitives involved, e.g., the described implementations may run on relatively slow and very cheap DSP packages and more importantly, on general purpose microprocessors.

Figure 4:
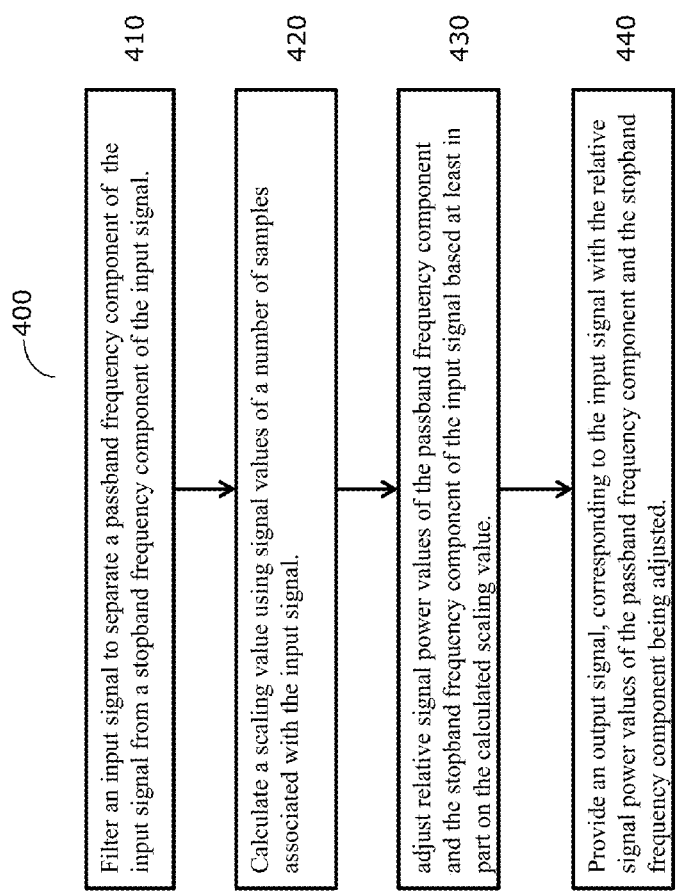
FIG. 4 is a flow chart of a method for psycho-acoustic spectral expansion, in accordance with at least one example embodiment.

FIG. 4 is a flow chart illustrating a method 400 for processing an input signal according to an example embodiment of the present invention. An input signal is filtered at block 410 to separate a passband component of the input signal from a stopband component of the input signal. The filtering may be achieved through a band-stop filter or a band-pass filter. At block 420, relative signal power, or amplitude, values of the passband component and the stopband component are adjusted based at least in part on a detected signal level associated with one or more samples of the input signal, or filtered input signal. The adjusting of the relative power or amplitude levels is achieved by using a scaling value calculated at block 410. The scaling value is calculated based at least in part on the detected signal level. The signal level is, for example, calculated using a root mean square value of the signal values of the samples. Alternatively, the signal level may be calculated using an average of the absolute signal values of the samples. An output signal is then provided at block 440, corresponding to the input signal, with the relative power, or amplitude, values of the passban component and the stopband component of the input signal being adjusted.

The invention provides a computationally efficient variable "loudness" compensation circuit, or device, which combines multiple analog based techniques converted for use in a general purpose Digital Signal Processing Units both dedicated DSP and microprocessor based circuits to compensate for the uneven spectral balance found in human hearing.

With the invention, a new way of adding "life" and "drama" may be provided to any musical or dramatic soundtrack by virtue of a Spectral Expansion function driven by the RMS detected level of the overall signal and by the "A-Weighted" instantaneous power at the input. In this embodiment, the low and high frequency components of the final output signal are driven so that the power ratio of stopband signal component, e.g., Bass+Treble, to the passband, or mid-band, signal component increases as the input signal gets smaller. As the input signal increases, or approaches a maximum value, the power ratio approaches unity.

According to an example embodiment, a combination of an A-Weighted Notch filter mechanism, gain ratios which change depending on signal level and spectral balance, and a continuously adjusting nature of the smoothed RMS detector add "life to the signal by acting as a dynamic range expander for the high and low frequency components, but NOT for the mid-band components of the audio signal. Audio expanders are commonly used to try to restore a sense of quality and "live" character to over compressed or under-digitized signals. According to at least one example embodiment, however, a new use of such audio expanders may be provided to "add the life back" to sound by enhancing the power of low and high frequencies' component usually associated with relatively lower hearing perception. According to an example embodiment, when the non-A weighted part of the spectrum is expanded, a much more lively and pleasing audio quality is achieved with arguably almost no negative side effects regardless of the type or style of the audio program being rendered.

According to at least one example embodiment, example methods, devices, or computer program instructions, described herein, may be used or integrated within a speaker system, an output audio device, an input audio device, an audio or speech encode, an audio or speech decoder, or any other audio device. The example methods, devices, or computer program instructions, described herein, may be also used or integrated within an audio playing device, a mobile device, a tablet, an audio recording device, or the like.

In conventional digital sound signal processing, the very low and very high frequencies are being amplified in a higher and non-linear ratio compared to the passband or mid-band content. Because the example circuit device, described herein is continuously re-evaluating depending on the overall signal level, the real result is that of an "LF/HF Only" expander whose ratio depends on, for example, a 70 milli second smoothed running average of the incoming signal's level, but which does not act on the mid-band at all.

Although there have been attempts in the past to try and use expanders to get "life" back into recorded music, there have been few attempts to do it with a frequency dependent approach. Such attempts were namely focused on the midband, and not the high and low frequencies component as is the case in the example embodiments described herein.

A person skilled in the art should appreciate that the example embodiment of circuit device described herein may be implemented as software instructions stored in a computer readable medium and executable by a processor. Any combination of one or more computer readable media may be utilized to implement the present invention. The computer readable medium may be a computer readable signal medium or a computer readable storage medium. Computer program code, or computer software instructions, for carrying out operations for example embodiments described herein may be written in any combination of one or more programming languages.

It will be understood that each block of the circuit diagrams, e.g., in FIGS. 2A-2C, -or FIG. 3, and combinations of blocks in the diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

The block diagrams in the Figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The corresponding structures, materials, acts, and equivalents of all means or step plus function elements in the claims below are intended to include any structure, material, or act for performing the function in combination with other claimed elements as specifically claimed.

While embodiments of the present invention has been particularly shown and described with references to example embodiments thereof, it will be understood by those skilled in the art that various changes in form and details may be made therein without departing from the scope of the invention encompassed by the appended claims. The terminology used herein was chosen to best explain the principles of the embodiments, the practical application or technical improvement over technologies found in the marketplace, or to enable others of ordinary skill in the art to understand the embodiments disclosed herein. For example, the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A method of processing an A-weighted input audio signal comprising:
    using a circuit device including a root mean square value (RMS) level detector to provide spectral expansion of the A-weighted input audio signal by:
    introducing a delay to the A-weighted input audio signal;
    filtering, using a band-stop filter, selected low and high frequency components of the A-weighted input audio signal components from the delayed A-weighted input audio signal; wherein the selected low and high frequency components are low and high frequencies associated with relatively lower hearing sensitivity;
    adjusting the relative audio signal power values of the filtered low and high frequency components of the delayed A-weighted input audio signal based at least in part on a continuously adjusted and smoothed amplitude dependent scaling value, the scaling value determined using audio signal values of a number of samples associated with the A-weighted input audio signal and a reference value equal to a threshold of human hearing in terms of sound pressure including:
        adjusting relative audio signal power values of the filtered low and high frequency components of the A-weighted input audio signal based at least in part on the scaling value includes:
        calculating a root mean square value (RMS) of the audio signal values of the number of samples associated with the A-weighted input audio signal;
        using the calculated root mean square (RMS) value to compute the scaling value;
        wherein adjusting relative audio signal power values of the passband frequency component and the stopband frequency component of the input audio signal includes adjusting relative audio signal power values at each sample of the input audio signal;
        calculating an average of absolute audio signal values of the number of samples associated with the A-weighted input audio signal to compute the scaling value; and
        using the computed scaling value to adjust the relative audio signal power values of the filtered low and high frequency components of the A-weighted input audio signal to enhance low and high frequency components of the A-weighted input audio signal;
    creating and providing an output audio signal corresponding to the A-weighted input audio signal, the output audio signal created by combining the delayed A-weighted input audio signal with the filtered low and high frequency components having relative audio signal power values adjusted based at least in part on the scaling value, such that low and high frequency components of the output audio signal are driven so that a power ratio of bass and treble stopband signal components increases as the A-weighted input audio signal gets smaller; and
    wherein the delay introduced to the A-weighted input audio signal compensates for a delay related to the adjusting of relative audio signal power values.

2. The method according to claim 1 wherein filtering the A-weighted input audio signal includes using a band-pass filter.

3. The method according to claim 1, wherein the number of samples associated with the A-weighted input audio signal include samples of filtered A-weighted input audio signal.

4. The method according to claim 1, wherein adjusting relative audio signal power values includes adjusting audio signal amplitude values.

5. The method according to claim 1 wherein adjusting relative audio signal power values of the filtered low and high frequency components of the A-weighted input audio signal based at least in part on the scaling value further includes:
    calculating an average of absolute audio signal values of the number of samples associated with the A-weighted input audio signal;
    using the calculated average of the absolute audio signal values to compute the scaling value; and
    using the computed scaling value to adjust the relative audio signal power values of the filtered low and high frequency components of the A-weighted input audio signal.

6. The method according to claim 5, wherein the number of samples associated with the A-weighted input audio signal include samples of filtered A-weighted input audio signal.

* * * * *